(12) United States Patent
Kaneko et al.

(10) Patent No.: US 9,496,403 B2
(45) Date of Patent: Nov. 15, 2016

(54) SEMICONDUCTOR DEVICE AND METHOD OF MANUFACTURING THE SAME

(71) Applicant: Renesas Electronics Corporation, Kanagawa (JP)

(72) Inventors: Kishou Kaneko, Kanagawa (JP); Hiroshi Sunamura, Kanagawa (JP); Yoshihiro Hayashi, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 157 days.

(21) Appl. No.: 13/710,209

(22) Filed: Dec. 10, 2012

(65) Prior Publication Data

US 2013/0181221 A1    Jul. 18, 2013

(30) Foreign Application Priority Data

Jan. 17, 2012  (JP) .................. 2012-006874

(51) Int. Cl.
| | |
|---|---|
| *H01L 27/12* | (2006.01) |
| *H01L 29/786* | (2006.01) |
| *H01L 29/66* | (2006.01) |
| *H01L 27/088* | (2006.01) |
| *H01L 27/02* | (2006.01) |
| *H01L 49/02* | (2006.01) |
| *H03K 19/00* | (2006.01) |
| *H01L 27/06* | (2006.01) |
| *H01L 23/522* | (2006.01) |
| *H01L 23/528* | (2006.01) |

(52) U.S. Cl.
CPC ......... *H01L 29/786* (2013.01); *H01L 27/0207* (2013.01); *H01L 27/0629* (2013.01); *H01L 27/0688* (2013.01); *H01L 27/088* (2013.01); *H01L 27/12* (2013.01); *H01L 27/1259* (2013.01); *H01L 28/20* (2013.01); *H01L 29/66742* (2013.01); *H03K 19/00* (2013.01); *H01L 23/5223* (2013.01); *H01L 23/5227* (2013.01); *H01L 23/5283* (2013.01); *H01L 2924/0002* (2013.01)

(58) Field of Classification Search
CPC .......... H01L 31/0428; H01L 27/0629; H01L 27/0635; H01L 27/0647–27/0738; H01L 27/1112; H01L 27/1214; H01L 27/1251; H01L 51/0508; H01L 2021/775; H01L 2924/13069
See application file for complete search history.

(56) References Cited

U.S. PATENT DOCUMENTS 6,555,420 B1 * 4/2003 Yamazaki .................. 438/158
2008/0314628 A1 * 12/2008 Song et al. .................. 174/257

(Continued)

FOREIGN PATENT DOCUMENTS

JP    2010-141230    6/2010

*Primary Examiner* — Cuong B Nguyen
(74) *Attorney, Agent, or Firm* — Young & Thompson

(57) ABSTRACT

A circuit including an inverter is provided for a wiring layer. A semiconductor device is provided with a wiring layer circuit which is formed over an insulating film and includes at least one inverter element. The inverter is provided with a first transistor element and a resistance element which is connected to the first transistor via a connection node. The first transistor element is provided with a gate electrode which is embedded in an interlayer insulating film including the insulating film, a gate insulating film which is formed over the interlayer insulating film and the gate electrode, and a first semiconductor layer which is formed over the gate insulating film between a source electrode and a drain electrode. The resistance element is provided with a second semiconductor layer which functions as a resistance. The first semiconductor layer and the second semiconductor layer are formed in the same layer.

12 Claims, 17 Drawing Sheets

(56) References Cited

U.S. PATENT DOCUMENTS

2010/0148171 A1  6/2010  Hayashi et al.
2010/0163874 A1* 7/2010  Koyama et al. ............... 257/57
2013/0075740 A1* 3/2013  Correia Fortunato et al. . 257/63

* cited by examiner

SEMICONDUCTOR DEVICE AND METHOD OF MANUFACTURING THE SAME

CROSS-REFERENCE TO RELATED APPLICATION

The disclosure of Japanese Patent Application No. 2012-006874 filed on Jan. 17, 2012 including the specification, drawings and abstract is incorporated herein by reference in its entirety.

BACKGROUND

The present invention relates to semiconductor devices and, in particular, relates to a semiconductor device and a method of manufacturing the same, in which a wiring layer circuit is provided for a multilayered wiring layer.

In a typical semiconductor device, a logic circuit part, which includes an active element such as a transistor, is formed over a semiconductor substrate, and plural wiring layers are formed over this logic circuit part. In such a semiconductor device, a desired function thereof is achieved by the logic circuit part.

However, there is a case in which another function is desired to be added although a basic function of the logic circuit part is not changed. In such a case, it is a problem from a point of cost to newly perform layout design. If a difference between these functions is absorbed by means of providing another additional circuit part without changing the logic circuit over the semiconductor substrate as far as possible, it is effective in terms of cost. A technique which responds to such a requirement is disclosed in Japanese Patent Laid-Open No. 2010-141230 (Patent Document 1).

Patent Document 1 discloses a technique which provides a semiconductor layer in a wiring layer and forms a semiconductor element using the semiconductor layer. Examples of material for the semiconductor layer are an oxide semiconductor such as InGaZnO (IGZO) and ZnO, poly-silicon, and amorphous silicon. The semiconductor element provided in the wiring layer is used as a transistor of a switching element, for example. Further, there is also disclosed a technique in which the semiconductor element is provided with a trap film and a back-gate electrode to be used as a memory element.

The technique of forming an active wiring element in an LSI multi-layer wiring utilizing the oxide semiconductor has been studied, and a basic structure of the active element is known from the above Patent Document 1. Further, basic action such as transistor action and diode action has been confirmed. For forming a logic circuit or the like using the active element in the multi-layered wiring layer, it is necessary to form an inverter element.

The active wiring element described in Patent Document 1 is an n-type transistor which can be formed in the wiring layer. An oxide semiconductor layer is used as a conduction channel, a lower layer of the conduction channel is used as a gate insulating film, and a contact from an upper layer to the oxide semiconductor layer is used as a source/drain (S/D) contact.

For the active wiring element of Patent Document 1, however, action of a single transistor is described, but an inverter structure which can be formed in the multi-layered wiring layer is not described, and thus it is not clear how to form an oscillation circuit or a logic circuit which can be formed in the multi-layered wiring layer.

Further, the influence of characteristic variation (against temperature and within a surface) is large in a transistor manufactured as described above. For a single transistor, it is known that a temperature dependence provides a large characteristic variation within a wafer, and, when an inverter element is formed by the use of a transistor and a resistance element (foundation transistor resistance, wiring resistance, or external resistance), sometimes variation is caused in an oscillation frequency and an output voltage because of the influence from the characteristic variation of the transistor.

Moreover, it is necessary to form a load resistance having a high resistance value in an area-saving manner. When a diffusion layer of a foundation layer, in which a logic circuit is formed, or the wiring layer is used for a load resistance, resistivity thereof is low and therefore there arises a problem that a large area is necessary for forming the load resistance having a high resistance value.

SUMMARY

Problem to be Solved by the Invention

There is desired a semiconductor device in which a wiring layer circuit or the like including an inverter element is formed in a multi-layered wiring layer.

According to an embodiment, a semiconductor device is provided with a wiring layer circuit which is formed over an insulating film and includes at least one inverter element. The inverter is provided with a first transistor element and a resistance element which is connected to the first transistor via a connection node. The first transistor element is provided with a gate electrode which is embedded in an interlayer insulating film including the insulating film, a gate insulating film which is formed over the interlayer insulating film and the gate electrode, and a first semiconductor layer which is formed over the gate insulating film between a source electrode and a drain electrode. The resistance element is provided with a second semiconductor layer which functions as a resistance. The first semiconductor layer and the second semiconductor layer are formed in the same layer.

According to another embodiment, a manufacturing method of a semiconductor device is provided with a step of forming a gate electrode embedded in an interlayer insulating film including an insulating layer, a step of forming a gate insulating film over the interlayer insulating film and the gate electrode, and a step of forming a semiconductor layer over the gate insulating film so as to cover the gate electrode via the gate insulating film in a transistor region.

There is provided a semiconductor device in which a wiring layer circuit and the like including an inverter element are formed in a multi-layered wiring layer.

DETAILED DESCRIPTION

Hereinafter, embodiments of a semiconductor device will be explained in detail with reference to the accompanying drawings.

Figure 1:
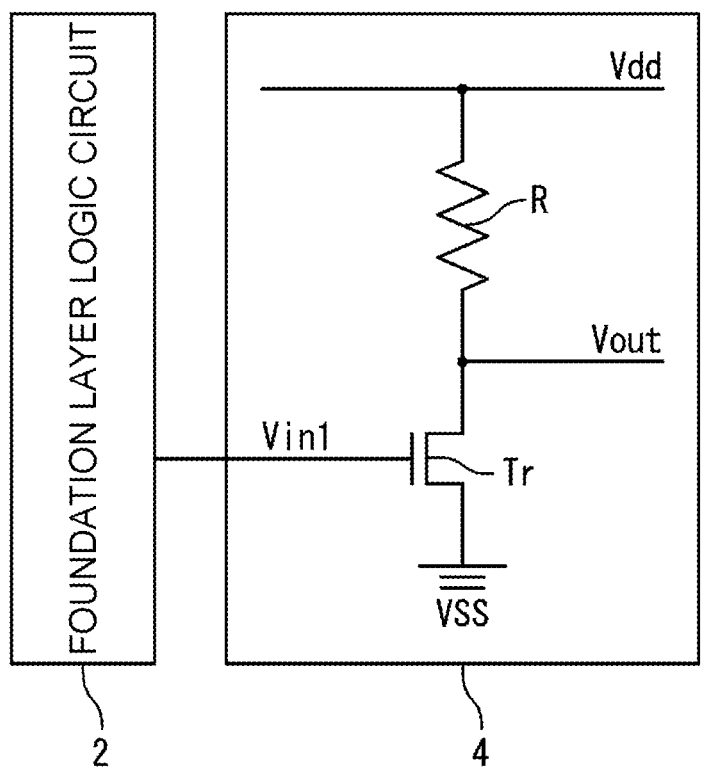
FIG. 1 is a circuit diagram showing an inverter element formed in a wiring layer circuit of a semiconductor device according to a first embodiment.

FIG. 1 is a circuit diagram of a semiconductor device according to a first embodiment. The semiconductor device includes a foundation layer logic circuit 2 and a wiring layer circuit 4. The logic circuit 2 is formed over a semiconductor substrate by a front-end process of a typical wafer process. An interlayer insulating film is formed over a layer for the foundation layer logic circuit 2 and a multilayered wiring layer is formed thereover by a back-end process of the typical wafer process. The wiring layer circuit 4 is formed for the multilayered wiring layer, that is, in the multilayered wiring layer or over the multilayered wiring layer. The wiring layer circuit 4 can be formed as various circuits. For example, the wiring layer circuit 4 can be formed as a circuit including an ESD protection element. Alternatively, the wiring layer circuit 4 can be formed as a logic circuit.

In the present embodiment, the wiring layer circuit 4 includes an inverter element. Thereby, the wiring layer circuit 4 has a logic operation function. The inverter element of the present embodiment is provided with a resistance element R and an n-type transistor element (MOSFET) Tr, differently from a CMOS circuit formed by a p-type transistor and an n-type transistor. The resistance element R and the n-type transistor element Tr are connected in series. Another element may be connected to this inverter element in series or in parallel, and further may be connected partially in parallel. Further, another element may be connected to a series stage of this inverter element.

In the present embodiment, the inverter element is connected between a power source voltage Vdd and a ground voltage Vss. An input signal Vin1 may be supplied to the wiring layer circuit 4 from the outside. Alternatively, an output signal from the foundation layer logic circuit 2 may be supplied to the gate of the transistor Tr as the input signal Vin1 of the wiring layer circuit 4. From a connection node between the resistance element R and the n-type transistor Tr, an output signal Vout is output as an inverted signal of the input signal Vin1.

Figure 2:
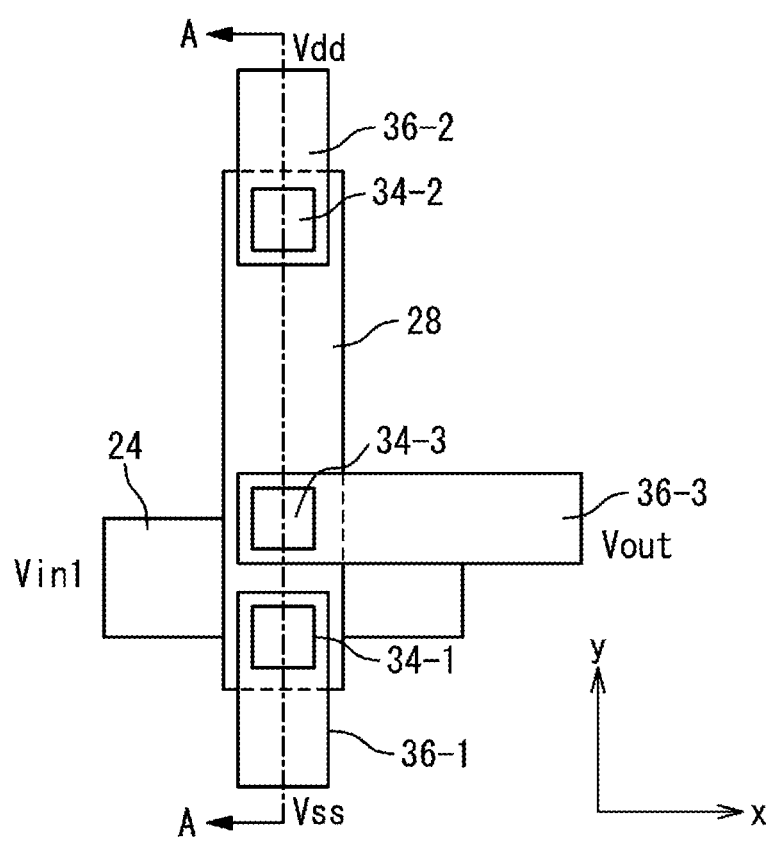
FIG. 2 is a diagram showing a pattern layout of the inverter element shown in FIG. 1.

FIG. 2 is a pattern diagram showing a pattern arrangement of the inverter in the wiring layer circuit 4. As shown in FIG. 2, a pattern of a gate electrode wiring 24 for the transistor Tr is extended in the x-direction as a first wiring layer. The pattern of the gate electrode wiring 24 transfers the input signal Vin1. A semiconductor layer 28 of the transistor Tr is extended so as to orthogonally cross the pattern of the gate electrode wiring 24 above the pattern of the gate electrode wiring 24 via a gate insulating film. That is, a pattern of the semiconductor layer 28 is extended in the y-direction. Thereby, in the semiconductor layer 28 crossing the pattern of the gate electrode 24, a region corresponding to a pattern edge of the gate electrode 24 in the width direction functions as a source region or a drain region.

A wiring pattern 36-1 as a second wiring layer is extended from one end part of the pattern of the semiconductor layer 28 in the -y-direction above the pattern of the semiconductor layer 28. The wiring pattern 36-1 is connected to the semiconductor layer 28 via a second wiring contact 34-1 which is formed in the source region of the transistor. In this manner, the wiring pattern 36-1 connects the pattern of the semiconductor layer 28 to the ground voltage Vss. Further, the second wiring contact 34-1 functions as a source (S) contact for the semiconductor layer 28 which functions as a channel layer of the n-type transistor element Tr.

A wiring pattern 36-2 in the second wiring layer is extended from one end part of the pattern of the semiconductor layer 28 in the y-direction above the pattern of the semiconductor layer 28. The wiring pattern 36-2 is connected to the semiconductor layer 28 via a second wiring contact 34-2. In this manner, the pattern 36-2 connects the pattern of the semiconductor layer 28 to the power source voltage Vdd.

A pattern 36-3 as the second wiring layer is extended from a center part of the pattern of the semiconductor layer 28 in the x-direction above the pattern of the semiconductor layer 28. The pattern 36-3 is connected to the semiconductor layer 28 via a second wiring contact 34-3 which is formed in the drain region of the transistor. In this manner, the pattern 36-3 functions as a wiring transferring the output signal Vout of the inverter element. Further, the second wiring contact 34-3 functions as a drain (D) contact for the semiconductor layer 28 which functions as the channel layer of the n-type transistor element Tr.

As described above, the second wiring contact 34-1 defines the source region and the second wiring contact 34-3 defines the drain region. Thereby, the n-type transistor is defined including the gate electrode 24, the source region, and the drain region. Further, a load resistance is defined between the drain contact and the second wiring contact 34-2 for the power source. In the present embodiment, the semiconductor layer 28 is formed by an oxide semiconductor. Therefore, resistivity of the semiconductor layer 28 is comparatively high and it is possible to secure a resistance necessary for circuit operation.

Here, in the present embodiment, as described above, the semiconductor layer 28 for the transistor Tr and the semiconductor layer 28 for the load resistance R are extended linearly in the y-direction. However, the semiconductor layers 28 is not necessarily extended in the y-direction in a strictly straight line. For example, the semiconductor layer 28 may be extended in the y-direction as a whole including three contacts in the present embodiment. When the patterns of the inverter element are arranged, the patterns of the transistor and the load resistance and the patterns of the input signal wiring Vin1 and the output signal wiring Vout may have a relationship, as a whole, which provides an efficient arrangement in terms of a pattern occupation ratio and the like.

Figure 3:
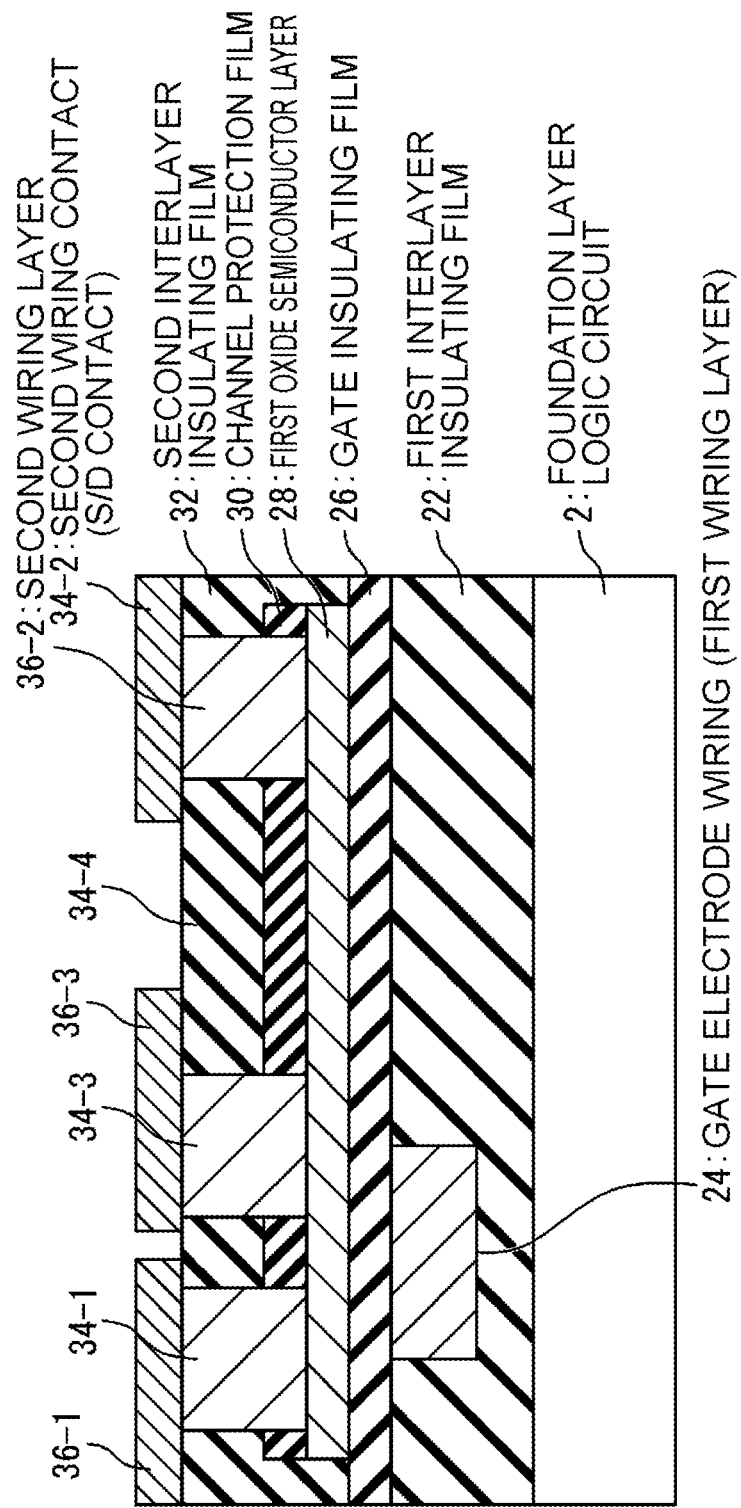
FIG. 3 is a cross-sectional view showing a cross-sectional structure of a wiring layer circuit in a semiconductor device along the A-A line of FIG. 2.

Next, a cross-sectional structure of a semiconductor device of the first embodiment will be explained. FIG. 3 shows a cross-sectional structure of the wiring layer circuit 4 along the A-A line of FIG. 2.

A first interlayer insulating film 22 is formed over a layer of the foundation layer logic circuit 2. In the first interlayer insulating film 22, the gate electrode wiring 24 is embedded as the first wiring layer. Over the gate electrode wiring 24 and the first interlayer insulating film 22, a gate insulating film 26, which functions as cap film for the first wiring layer wiring, is formed. Over the gate insulating film 26, a first oxide semiconductor layer 28 is formed as the semiconductor layer. The first oxide semiconductor layer 28 is formed by any of materials InGaZnO, InZnO, ZnO, ZnAlO, and ZnCuO. Over the first oxide semiconductor layer 28, a channel protection film 30 is formed having the same planar shape as the first oxide semiconductor layer 28. Over the gate insulating film 26, a second interlayer insulating film 32 is formed so as to cover the first oxide semiconductor layer 28 and the channel protection film 30. Plural second wiring contacts 34 are formed so as to pass through the second interlayer insulating film and the channel protection film. One of the second wiring contacts 34-1 is disposed on one side of the gate electrode wiring 24 in the width direction so as to define the source region, and another one of the second wiring contacts 34-3 is disposed on the other side of the gate electrode in the width direction so as to define the drain region. The other second wiring contact 34-2 is disposed in a region where the gate electrode wiring 24 is not disposed. The second wiring contacts are connected to the second wiring layers 36-1, 36-2, and 36-3 which are formed over the second insulating film, respectively.

In the structure of FIG. 3, the first oxide semiconductor layer 28 functions as the conduction channel of the transistor Tr and also as the load resistance. Apart where the gate electrode wiring 24 is formed in the lower layer of the first oxide semiconductor layer 28 functions as the transistor Tr and a part where the wiring layer 24 is not formed in the lower layer functions as the resistance R. That is, the n-type transistor Tr is formed by the gate electrode wiring 24, the gate insulating film 26, the first oxide semiconductor layer 28, and the second wiring contacts 34-1, and 34-3. The load resistance R is formed by the first oxide semiconductor layer 28 in a range from the transistor Tr to the second wiring contacts 34-2.

This inverter element layout is a layout providing a basic structure of an inverter using a load resistance. Since the layout is simple, it is also possible to suppress occurrence of a manufacturing problem. Moreover, it is also possible to expect a reduction of manufacturing cost. The load resistance is formed using bulk resistance (1 to 10 Ωcm) of the first oxide semiconductor layer 28. When an equivalent load resistance is formed by a silicon diffusion layer of the foundation or a poly-silicon wiring, the area thereof becomes considerably large (i.e., larger in 1 to 2 orders). On the other hand, the layout of the first embodiment is suitable for realizing a load resistance having a high resistance value in an area saving manner. Moreover, the inverter element formed in the wiring layer can realize the transistor Tr and the load resistance R originally without using any element of the foundation layer at all, and therefore the inverter becomes an extremely area-saving inverter element.

Next, with reference to FIGS. 4A to 4D, a manufacturing method of the semiconductor device of the first embodiment will be explained.

Figure 4A:
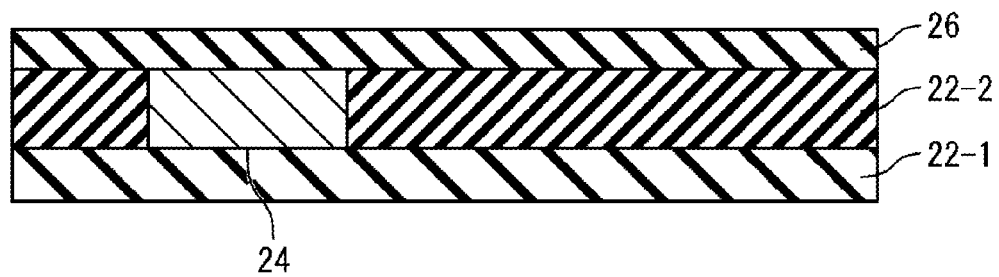
FIG. 4A is a cross-sectional view showing a manufacturing process of the wiring layer circuit shown in FIG. 3.

First, with reference to FIG. 4A, the foundation layer logic circuit 2 is formed over the semiconductor substrate by the front process of the wafer process. Thereover, an interlayer insulating film 22-1 is formed as a part of the first interlayer insulating film 22. Over the interlayer insulating film 22-1, a conductive film such as an impurity-doped poly-silicon film, for example, is formed and patterned. Thereby, the gate electrode wiring 24 is formed. The gate electrode wiring 24 may be connected with a signal wiring from the logic circuit via a contact (not shown in the drawing). After that, an interlayer insulating film 22-2 is formed so as to cover the whole surface of the substrate. Successively, CMP is performed so as to expose the upper surface of the gate electrode wiring 24 and a flat surface is formed. The gate insulating film 26 is formed over the flat surface.

Figure 4B:
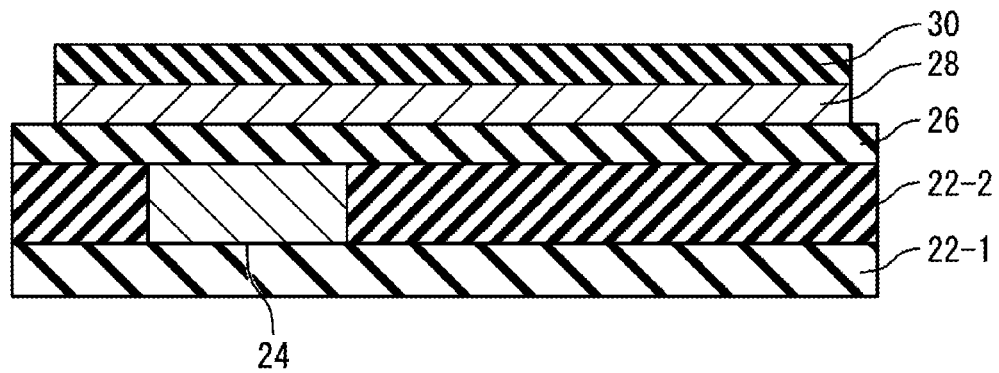
FIG. 4B is a cross-sectional view showing a manufacturing process of the wiring layer circuit shown in FIG. 3.

Next, with reference to FIG. 4B, the first oxide semiconductor layer 28 is formed over the gate insulating film 26, and further the channel protection film 30, which works also as a hard mask, is formed thereover. Successively, the channel protection film 30 is patterned by dry-etching, and the first oxide semiconductor layer 28 is patterned by the use of the remaining film as a hard mask. Thereby, the channel protection film 30 and the first oxide semiconductor layer 28 come to have the same pattern shape.

Figure 4C:
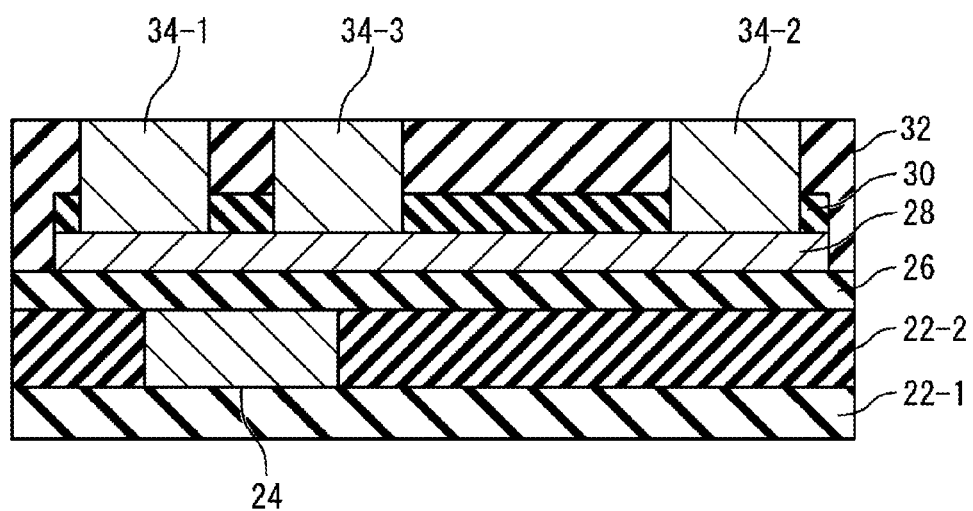
FIG. 4C is a cross-sectional view showing a manufacturing process of the wiring layer circuit shown in FIG. 3.

Next, with reference to FIG. 4C, so as to cover the channel protection film 30 and the first oxide semiconductor layer 28, the second interlayer insulating film 32 is formed over the gate insulating film 26. After that, the surface of the second interlayer insulating film 32 is made flat. Successively, holes for the second wiring contacts 34 are formed by dry etching so as to reach the first oxide semiconductor layer 28 through the second interlayer insulating film 32 and the channel protection film 30. After that, contact material is deposited so as to fill the holes. After that, the contact material over the second interlayer insulating film 32 is removed.

Figure 4D:
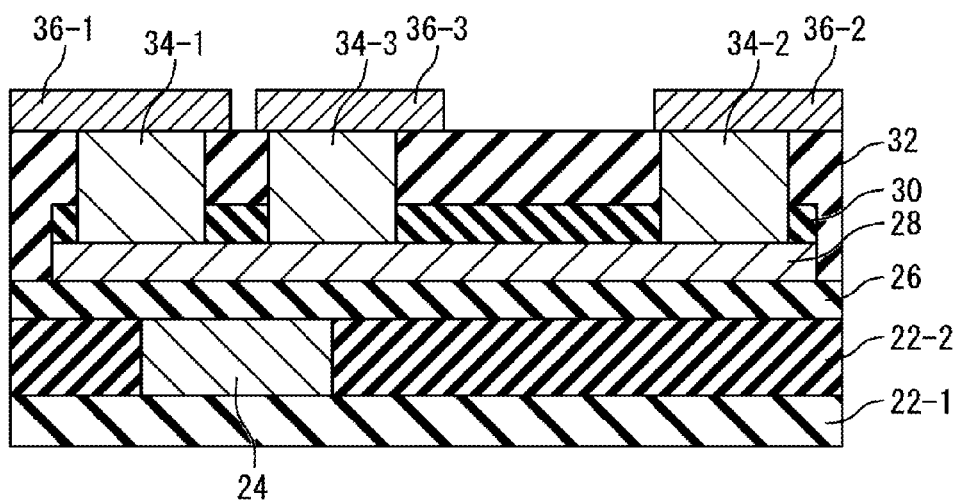
FIG. 4D is a cross-sectional view showing a manufacturing process of the wiring layer circuit shown in FIG. 3.

Next, with reference to FIG. 4D, material for the second wiring layer is deposited over the whole surface so as to cover the second wiring contacts 34 and the second interlayer insulating film 32. Successively, patterning is performed so as to leave the patterns for the second wiring layer 36 which are connected to the respective second wiring contacts 34. In this manner, the inverter shown in FIG. 3 is formed.

Next, with reference to FIGS. 5 and 6, a variation example of the semiconductor device of the first embodiment will be explained.

Figure 5:
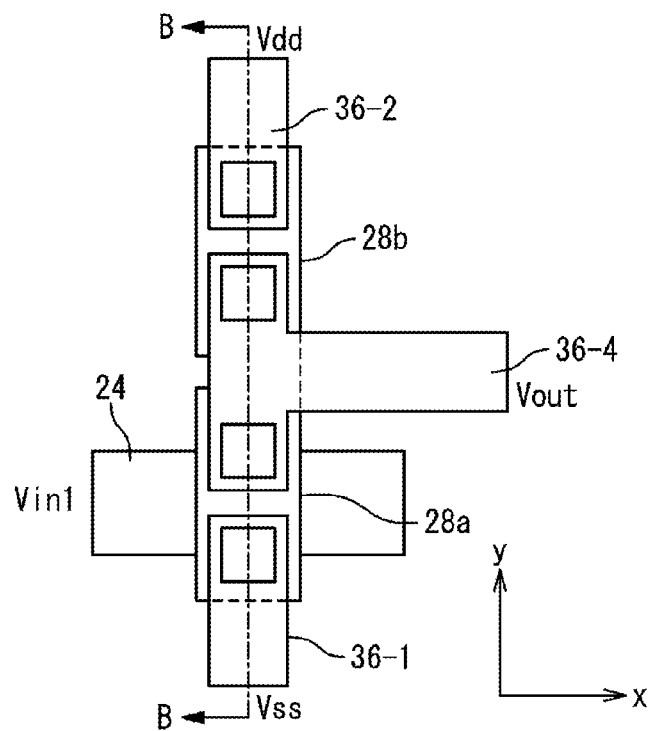
FIG. 5 is a diagram showing a variation example of a pattern layout for the inverter element shown in FIG. 1.

With reference to FIG. 5, a different point of this variation example from the semiconductor device of the first embodiment is that the pattern of the first oxide semiconductor layer 28 is divided into two patterns 28a and 28b. The channel protection film 30 may be divided or may not be divided correspondingly to the patterns 28a and 28b of the first oxide semiconductor layer 28. Except for points related to this different point, the structure of the first embodiment is not changed. Therefore, only the different point will be explained. So as to connect the two patterns 28a and 28b of the first oxide semiconductor layer 28, a second wiring pattern 36-4 is employed replacing the second wiring pattern 36-3. The second wiring pattern 36-4 is connected to the pattern 28a of the first oxide semiconductor layer by a second wiring contact 34-3 and connected to the pattern 28b of the first oxide semiconductor layer by a second wiring contact 34-4. Further, a part of the second wiring pattern 36-4 is extended in the x-direction and forms a wiring pattern for the output signal Vout.

According to this variation example, the semiconductor layer between the power source voltage Vdd and the ground voltage Vss is divided into the two patterns for the transistor Tr and the resistance R. As a result, it is possible to suppress a phenomenon such as one that the current distribution in a part corresponding to the resistance R is affected by a current path of the transistor and the resistance value becomes unstable, and it is possible to expect a more stable action.

Figure 6:
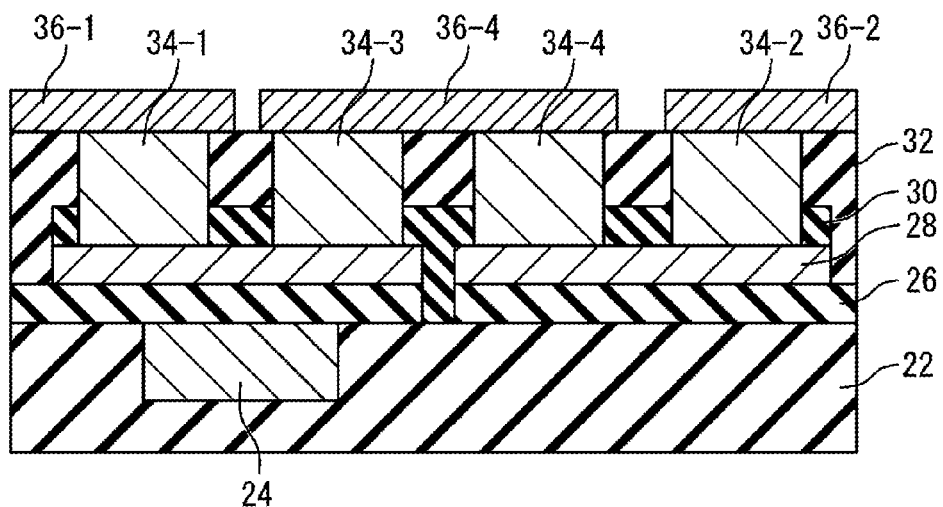
FIG. 6 is a cross-sectional view showing a cross-sectional structure of a variation example for a wiring layer circuit of a semiconductor device along the B-B line of FIG. 5.

Next, with reference to FIG. 6, each of the channel protection film 30 and the first oxide semiconductor 28 is divided into two between the transistor TR and the load resistance R. A manufacturing method of the semiconductor device according to this variation example might be apparent to a person skilled in the art from FIGS. 4A to 4D of the manufacturing method for of the semiconductor device of the first embodiment. Accordingly, explanation will be omitted.

Subsequently, with reference to FIGS. 7, 8 and 9, a semiconductor device according to a second embodiment will be explained.

Figure 7:
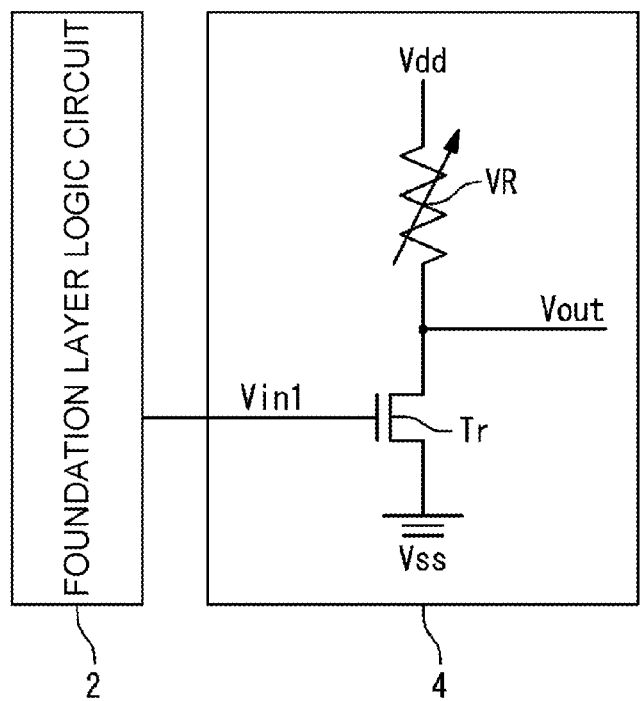
FIG. 7 is a circuit diagram showing an inverter element formed in a wiring layer circuit of a semiconductor device according to a second embodiment.

FIG. 7 is a circuit diagram of the semiconductor device according to the second embodiment. The semiconductor device includes a foundation layer logic circuit 2 and a wiring layer circuit 4. The foundation layer logic circuit 2 is formed over a semiconductor substrate by the front-end process of the typical wafer process, as in the first embodiment. An interlayer insulating film is formed over a layer for the foundation layer logic circuit 2, and a wiring layer is formed thereover in the back-end process. The wiring layer circuit 4 is formed for the wiring layer.

The wiring layer circuit 4 is provided with an inverter element. The inverter element is configured with a variable load resistance VR and an n-type transistor (MOSFET) Tr, differently from a CMOS inverter element formed by a p-type transistor and an n-type transistor. The variable resistance element VR and the n-type transistor Tr are connected in series. Another element may be connected to this inverter in series or in parallel, and further may be connected partially in parallel. Further, another element may be connected to a series stage of this inverter element.

The variable load resistance VR and the n-type transistor Tr are connected in series between a power source voltage Vdd and a ground voltage Vss. As in the first embodiment, an output signal from the foundation layer logic circuit 2 is supplied to the gate of the transistor Tr as an input signal Vin1 of the wiring layer circuit 4. From a connection node of the variable load resistance VR and the n-type transistor, an output signal Vout is taken out as an inverted signal of the input signal Vin1.

Figure 8:
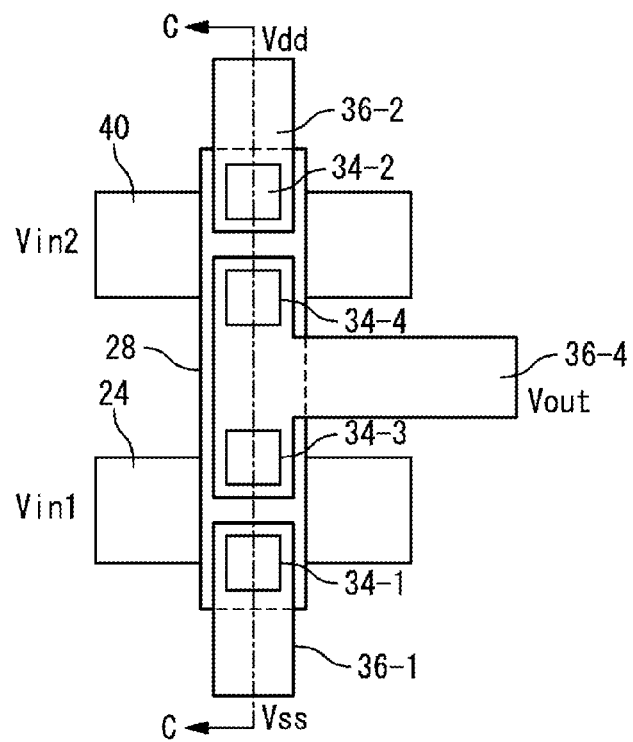
FIG. 8 is a diagram showing a pattern layout of the inverter element shown in FIG. 7.
Figure 9:
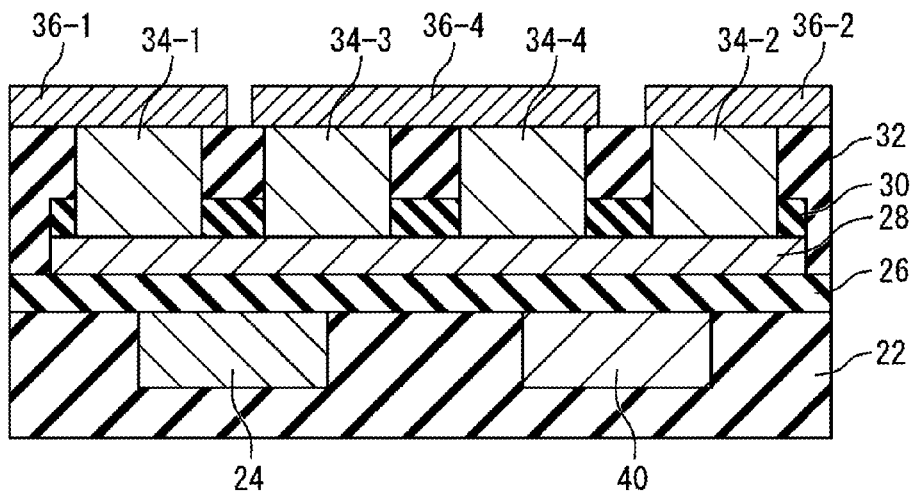
FIG. 9 is a cross-sectional view showing a cross-sectional structure of a wiring layer circuit in a semiconductor device along the C-C line of FIG. 7.

FIG. 8 is a pattern diagram showing a pattern arrangement of the inverter in the wiring layer circuit 4. As shown in FIG. 8, a pattern of a gate electrode wiring 24 for the transistor Tr is extended in the x-direction as a first wiring layer. The pattern of the gate electrode wiring 24 transfers the input signal Vin1. A semiconductor layer 28 of the n-type transistor Tr is extended so as to orthogonally cross the pattern of the gate electrode wiring 24 above the pattern of the gate electrode wiring 24. That is, the pattern of the semiconductor layer 28 is extended in the y-direction. Thereby, in the semiconductor layer 28 crossing the pattern of the gate electrode 24, a region corresponding to a pattern edge of the gate electrode 24 in the width direction functions as a source region or a drain region.

A wiring pattern 36-1 in a second wiring layer is extended from one pattern end part of the semiconductor layer 28 in the −y-direction above the pattern of semiconductor layer 28. The wiring pattern 36-1 is connected to the semiconductor layer 28 via a second wiring contact 34-1 which is formed in the source region of the transistor. In this manner, the wiring pattern 36-1 connects the pattern of the semiconductor layer 28 to the ground voltage Vss. Further, the second wiring contact 34-1 functions as a source (S) contact for the semiconductor layer 28 which functions as a channel layer of the n-type transistor element Tr.

A wiring pattern 36-2 in the second wiring layer is extended from one pattern end part of the the semiconductor layer 28 in the y-direction above the pattern of the semiconductor layer 28. The wiring pattern 36-2 is connected to the semiconductor layer 28 via a second wiring contact 34-2. In this manner, the wiring pattern 36-2 connects the pattern of the semiconductor layer 28 to the power source voltage Vdd.

A wiring pattern 36-4 in the second wiring layer is extended in the y-direction and also extended in the x-direction at the pattern center part of the semiconductor layer 28 above the pattern of the semiconductor layer 28. The wiring pattern 36-4 is connected to the semiconductor layer 28 via a second wiring contact 34-3 which is formed in the drain region of the transistor. In this manner, the wiring pattern 36-4 functions as a wiring for transferring the output signal Vout of the inverter element. Further, the second wiring contact 34-3 functions as a drain (D) contact for the semiconductor layer 28 which functions as the channel layer of the n-type transistor element Tr. In addition, the wiring pattern 36-4 is connected to the semiconductor layer 28 via a second wiring contact 34-4. An adjustment electrode pattern 40 is formed under the semiconductor layer 28 via a gate insulating film 26 so as to extend in the x-direction. The second wiring contacts 34-4 and 34-2 are provided at edge parts of the adjustment electrode pattern 40 in the y-direction and function as source/drain contacts of a transistor structure. By applying a voltage to the adjustment electrode pattern 40, it is possible to adjust the resistance value between the second wiring contacts 34-4 and 34-2.

Figure 14A:
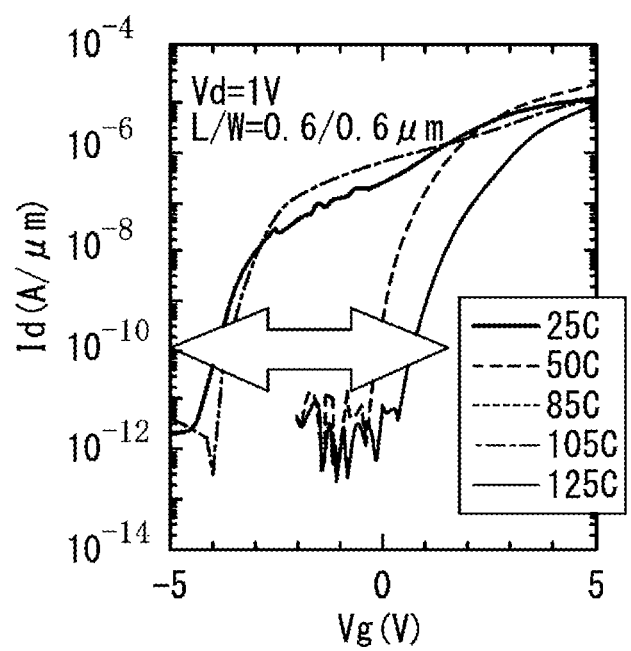
FIG. 14A is a diagram showing characteristics of transistors formed in the same wafer.
Figure 14B:
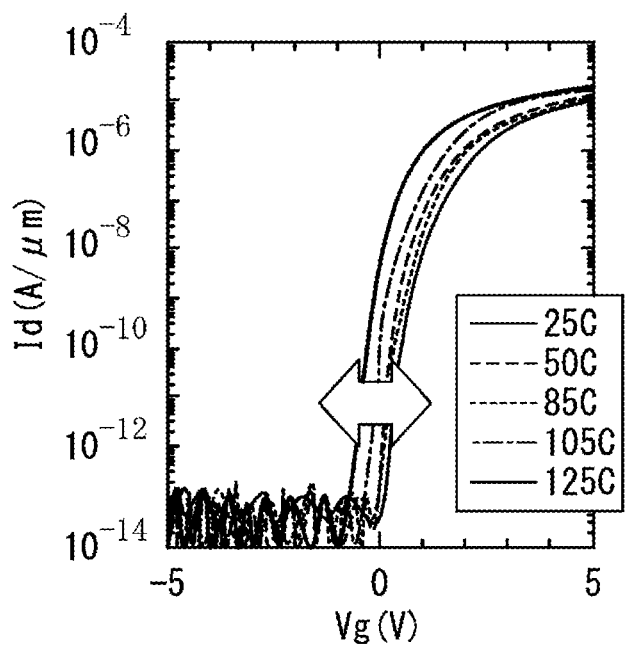
FIG. 14B is a diagram showing characteristics of transistors formed in the same wafer.
Figure 15:
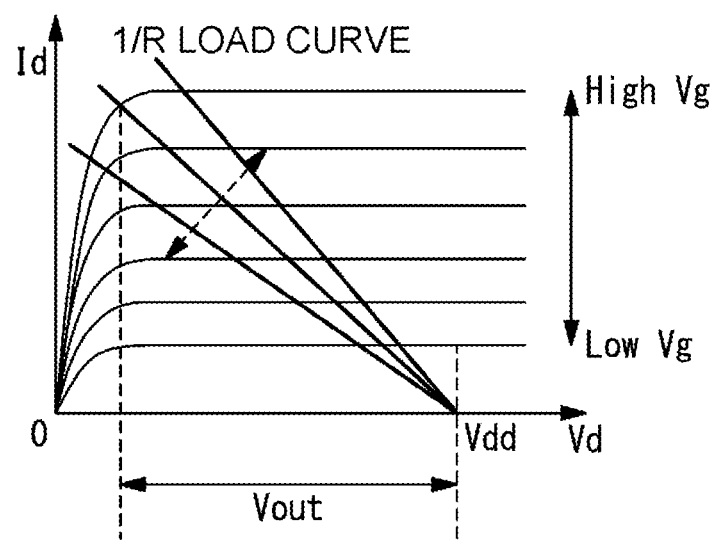
FIG. 15 is a diagram showing a method of controlling a load resistance by changing an adjustment voltage.

Each of FIGS. 14A and 14B is a graph showing a relationship between a gate voltage (Vg) and a drain current (Id) at a constant power source voltage. FIGS. 14A and 14B show a variation of transistor characteristics for the transistors formed at different positions in a wafer. The transistors shown in FIG. 14A have a larger variation of a temperature dependence than the transistors shown in FIG. 14B. When the characteristics have a large variation in this manner, it is difficult to guarantee a quality for each product. Meanwhile, FIG. 15 shows a characteristic of a drain voltage and a drain current when a gate voltage is changed as a parameter. At this time, this characteristic shows that it is possible to define a voltage width of switching by changing a load resistance value.

The transistor structure can be defined by the second wiring contacts 34-4 and 34-2, the adjustment electrode wiring 40, and the semiconductor layer 28. Here, the adjustment electrode wiring 40 functions as a gate electrode and the resistance value between the second wiring contacts 34-4 and 34-2 can be changed by adjustment of a voltage applied to the adjustment electrode wiring 40. That is, by adjusting the voltage applied to the adjustment electrode wiring 40, it is possible to change the resistance value of the load resistance and adjust the load resistance to the most appropriate load resistance in the characteristic chart shown in FIG. 15. Thereby, it is possible to eliminate the variation depending on the position difference in the wafer. Further, while not shown in the drawing, when the adjustment voltage is changed by a circuit which changes the adjustment voltage according to a change of temperature or another parameter, it is possible to compensate a variation caused by a change of the parameter.

Next, a structure of a semiconductor device of the second embodiment will be explained. FIG. 9 shows a cross-sectional structure of the wiring layer circuit 4 along the C-C line of FIG. 8.

A first interlayer insulating film 22 is formed over the foundation layer logic circuit 2. The gate electrode wiring 24 and the adjustment electrode wiring 40 are embedded in the first interlayer insulating film 22 as the first wiring layer. Over the gate electrode wiring 24, the adjustment electrode wiring 40, and the first interlayer insulating film 22, the gate insulating film 26 is formed as a cap film for the wiring in the first wiring layer. Over the gate insulating film 26, a first oxide semiconductor layer 28 is formed as a channel layer. Over the first oxide semiconductor layer 28, a channel protection film 30 is formed having the same planar shape as the first oxide semiconductor layer 28. Note that, the channel protection film 30 functions also as a hard mask. Over the gate insulating film 26, a second interlayer insulating film 32 is formed so as to cover the first oxide semiconductor layer 28 and the channel protection film 30. The second wiring contacts 34 are formed so as to pass through the second interlayer insulating film 32 and the channel protection film 30.

One of the second wiring contacts 34-1 is disposed on one side of the gate electrode wiring 24 so as to define the source region and another one of the second wiring contacts 34-3 is disposed on the other side of the gate electrode so as to define the drain region. One of the second wiring contacts 34-4 is disposed on one side of the adjustment electrode wiring 40 so as to define a source region and another one of the second wiring contacts 34-2 is disposed on the other side of the adjustment electrode wiring so as define a drain region.

The wiring pattern 36-1 connects the source region of the transistor Tr to the ground voltage Vss via the second wiring (source) contact 34-1. The wiring pattern 36-2 connects the drain region of the adjustment transistor structure to the power source voltage Vdd via the second wiring (drain) contact 34-2. The wiring pattern 36-4 connects the source region of the adjustment transistor structure and the drain region of the transistor via the second wiring contacts 34-3 and 34-4. At this time, the second wiring contacts 34-3, 34-4, and the like are formed so as to cause the resistance through the wiring pattern 36-4 between the source region of the adjustment transistor structure and the drain region of the transistor to become smaller than the resistance of the first oxide semiconductor layer 28 in the corresponding section.

While, differently from the variation example of the first embodiment, the first oxide semiconductor layer 28 is not divided into two patterns 28a and 28b, the second wiring pattern 36-4 is formed in the section between the variable load resistance VR and the transistor Tr to realize resistance reduction, and therefore the influence of the semiconductor layer 28 is suppressed. Also in the present embodiment, however, the first oxide semiconductor layer 28 may be divided into two patterns as in the variation example of the first embodiment. Alternatively, the pattern width thereof may be reduced. Thereby, it is possible to reduce the influence between the variable load resistance VR and the transistor Tr.

This inverter layout is a layout of a basic structure of an inverter using a variable load resistance, as the layout of the first embodiment. The load resistance is supposed to be based on bulk resistance (1 to 10 Ωcm) of the first oxide semiconductor layer 28. When an equivalent resistance is formed by a silicon diffusion layer of the foundation or a wiring, the area thereof becomes considerably large (i.e., larger in 1 to 2 orders). On the other hand, the layout of the second embodiment is suitable for realizing a load resistance having a high resistance value in an area saving manner. Moreover, the inverter element which can be formed in the wiring layer can realize the transistor Tr and the variable load resistance VR originally without using any element of the foundation layer at all, and therefore the inverter becomes an extremely area-saving inverter element.

Figure 10:
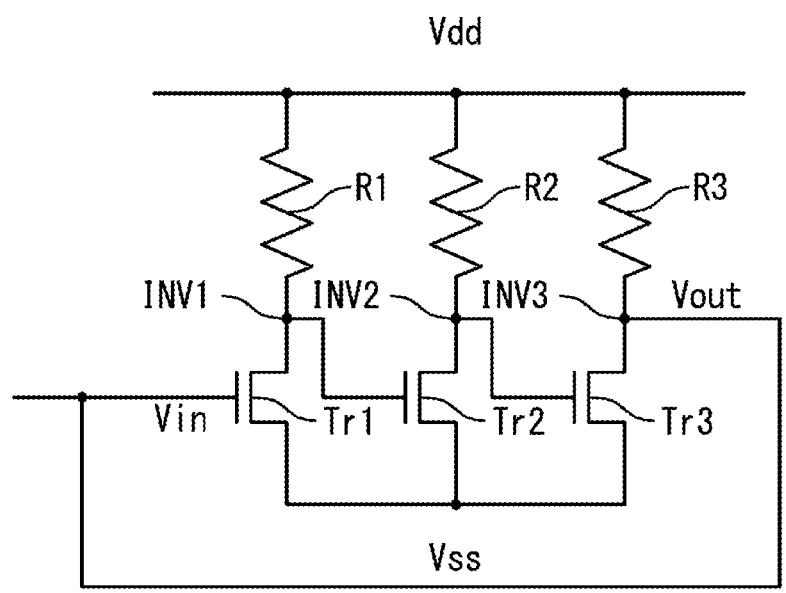
FIG. 10 is a circuit diagram of a wiring layer circuit according to a third embodiment which uses an inverter element according to the first embodiment.

Next, a semiconductor device according to a third embodiment will be explained. FIG. 10 shows a ring oscillator which is a semiconductor device having the configuration that an odd number of inverter elements according to the first embodiment are connected in a chain and an output signal Vout of the last stage inverter element is put into the input of the first stage inverter element. Thereby, it is possible to realize a circuit having a desired oscillation frequency.

With reference to FIG. 10, three inverters INV1 to INV3 are connected so as to form a chain. That is, the output Vout1 of a first inverter INV1 is connected to the input Vin2 of a second inverter INV2. Further, the output Vout2 of the second inverter INV2 is connected to the input Vin3 of a third inverter INV3. The output Vout3 of the third inverter INV3 is connected to the input Vin1 of the first inverter INV1.

Figure 11:
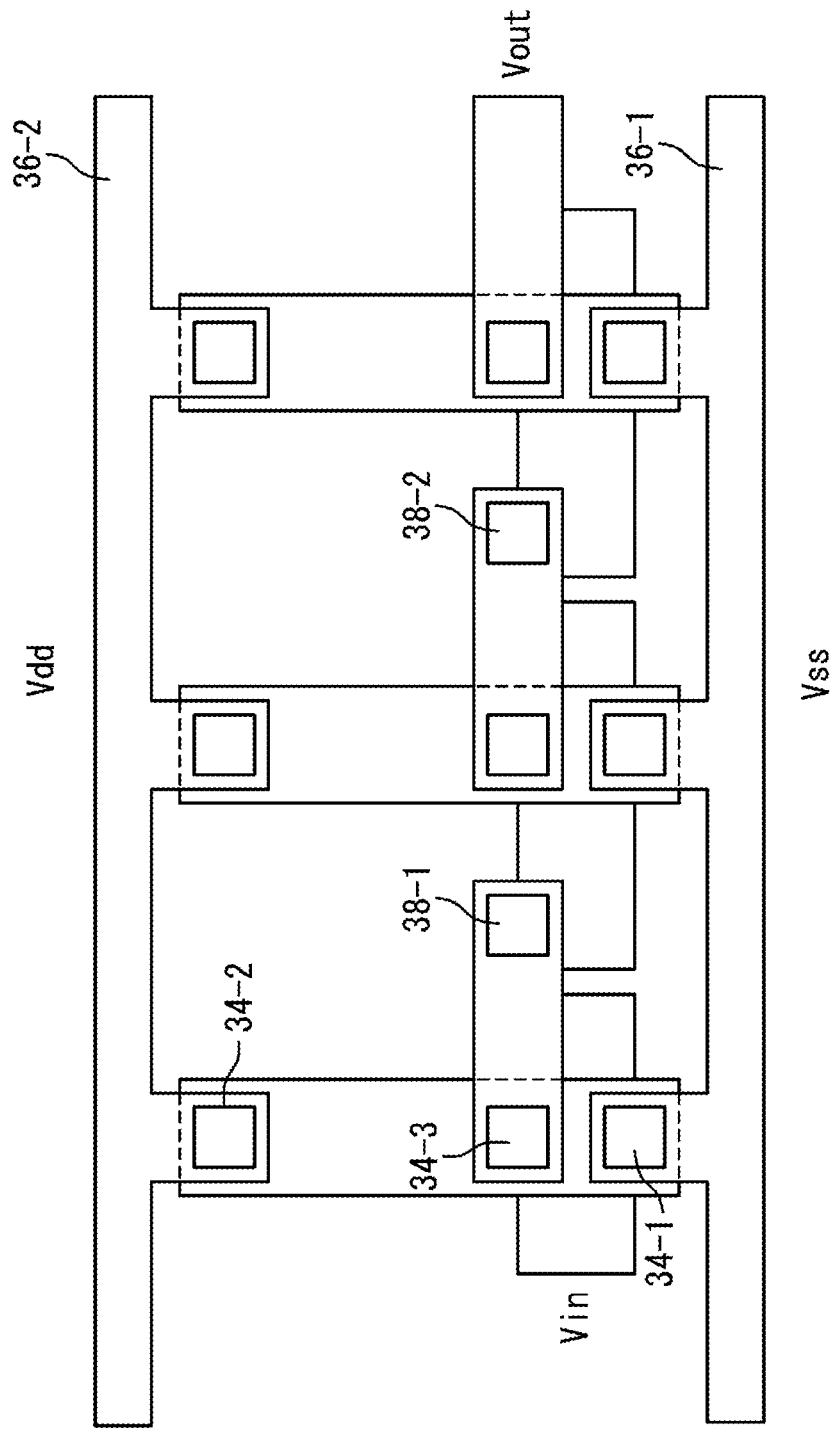
FIG. 11 is a diagram showing a pattern layout of the wiring layer circuit shown in FIG. 10.

With reference to FIG. 11, each layout of the three inverters INV1 to INV3 is the same as the layout shown in FIG. 2. A different point is that a contact 38-1 is formed for connecting the second wiring pattern 36-3 of the first inverter INV1 and the pattern of the gate electrode wiring 24 in the second inverter INV2. Further, a contact 38-2 is formed for connecting the second wiring pattern 36-3 of the second inverter INV2 and the pattern of the gate electrode wiring 24 in the third inverter INV3. Moreover, a contact (not shown in the drawing) is formed for connecting the second wiring pattern 36-3 of the third inverter INV3 and the pattern of the gate electrode wiring 24 in the first inverter INV1.

Figure 12:
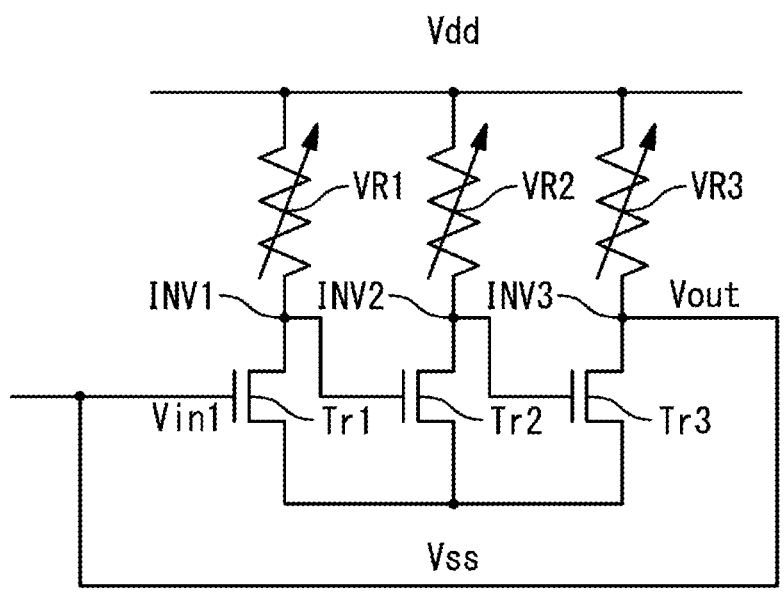
FIG. 12 is a circuit diagram of a wiring layer circuit according to a fourth embodiment which uses an inverter element according to the second embodiment.

Next, a semiconductor device according to a fourth embodiment, which uses the inverter according to the second embodiment, will be explained. With reference to FIG. 12, three inverters INV11 to INV13 are connected to form a chain. That is, the output Vout1 of a first inverter INV11 is connected to the input Vin2 of a second inverter INV12. Further, the output Vout2 of the second inverter INV12 is connected to the input Vin3 of a third inverter INV13. The output Vout3 of the third inverter INV13 is connected to the input Vin1 of the first inverter INV11.

Figure 13:
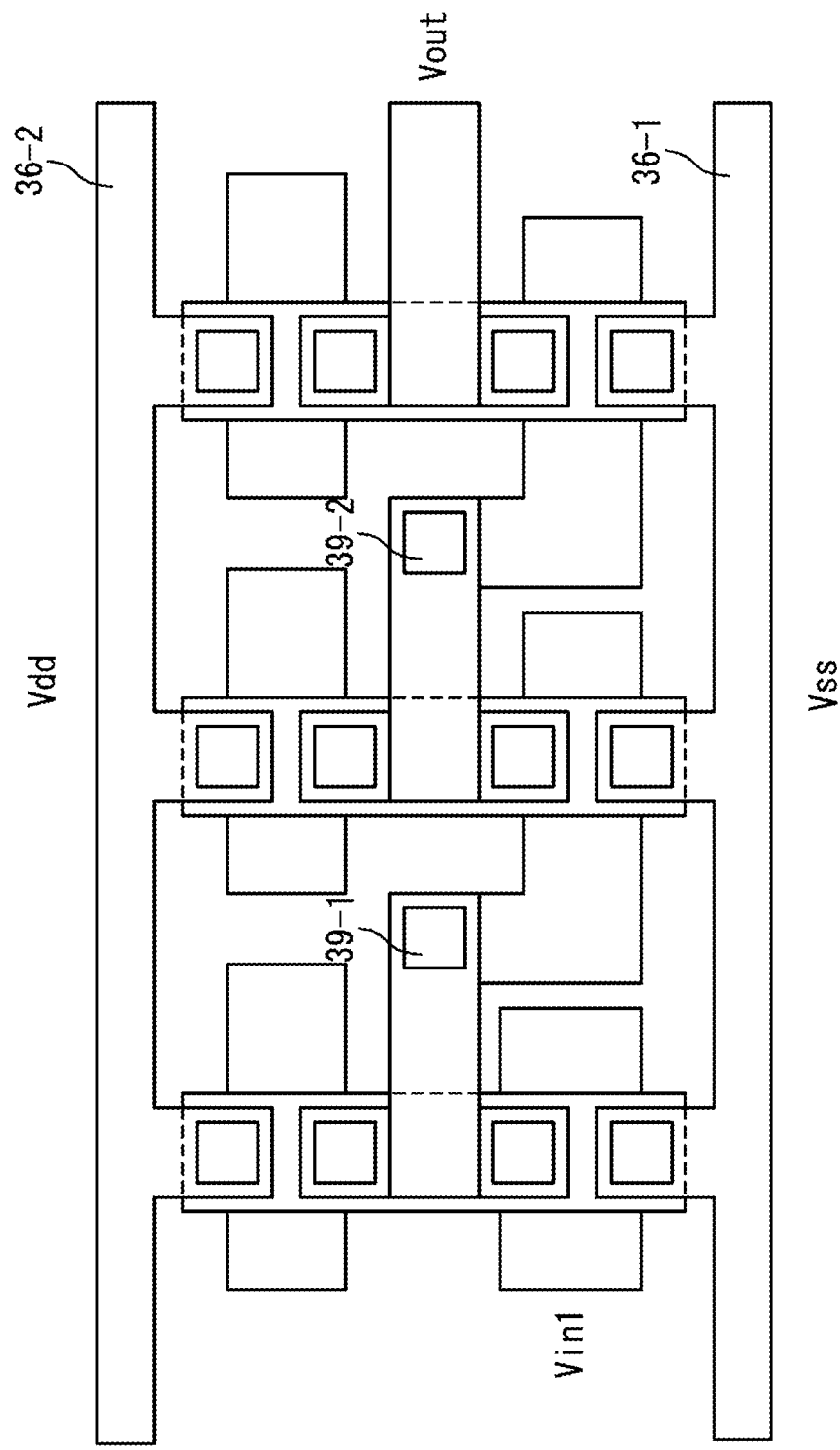
FIG. 13 is a diagram showing a pattern layout of the wiring layer circuit shown in FIG. 12.

With reference to FIG. 13, each layout of the three inverters INV11 to INV13 is the same as the layout shown in FIG. 8. A different point is that a contact 39-1 is formed for connecting the second wiring pattern 36-4 in the first inverter INV11 and the pattern of the gate electrode wiring 24 in the second inverter INV12. Further, a contact 39-2 is formed for connecting the second wiring pattern 36-4 of the second inverter INV12 and the pattern of the gate electrode wiring 24 in the third inverter INV13. Moreover, a contact (not shown in the drawing) is formed for connecting the second wiring pattern 36-4 of the third inverter INV13 and the pattern of the gate electrode wiring 24 in the first inverter INV11.

While, in this embodiment, the adjustment electrodes for the variable resistances VR of the inverter elements are shown to be separated from each other, usually these are connected with each other and a common voltage is applied. At this time, there would be a case that a characteristic variation is caused among the inverter elements. In such a case, a silicon nitride trap layer (not shown in the drawing) may be formed replacing the channel protection film 30 in a part corresponding to the channel region of the semiconductor layer 28 in the region of the variable load resistance VR. By electric charge injection into the trap layer, the threshold value of the transistor in the region of the variable load resistance VR can be changed. Thereby, it is possible to set the value of the variable resistance in the inverter element to the most appropriate value.

Figure 16:
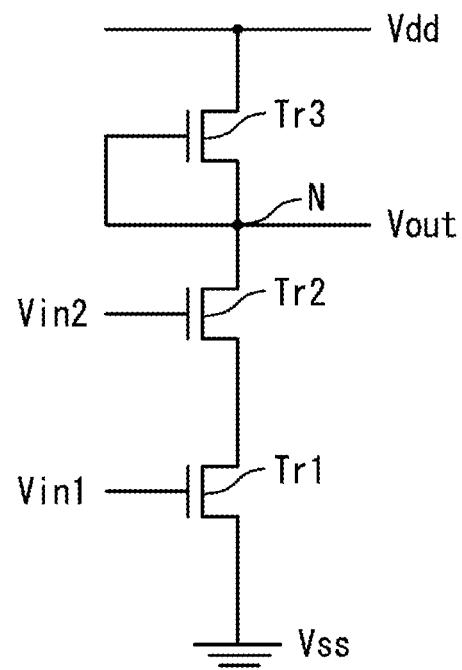
FIG. 16 is a circuit diagram showing a NAND element formed in a wiring layer circuit according to a fifth embodiment.

Next, a semiconductor device according to a fifth embodiment will be explained. With reference to FIG. 16, three transistors Tr1, Tr2, and Tr3 are connected in series between a power source voltage Vdd and a ground voltage Vss. The transistor Tr3 is a reversely connected transistor having a diode connection. Thereby, the transistor Tr3 shows a predetermined resistance value which is provided by a diode in the reverse direction. Input signals Vin1 and Vin2 are supplied to the gate electrodes of the transistor Tr1 and Tr2, respectively. An output signal Vout is taken out from a connection node N between the transistors Tr2 and the Tr3.

Figure 17:
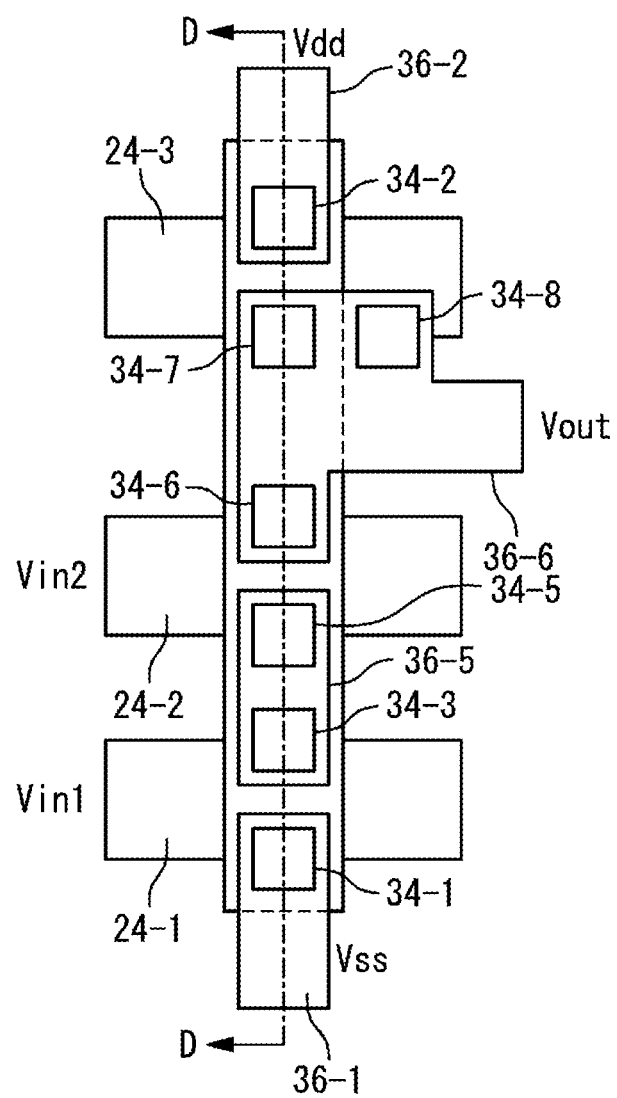
FIG. 17 is a diagram showing a pattern layout of the NAND element shown in FIG. 16.
Figure 18:
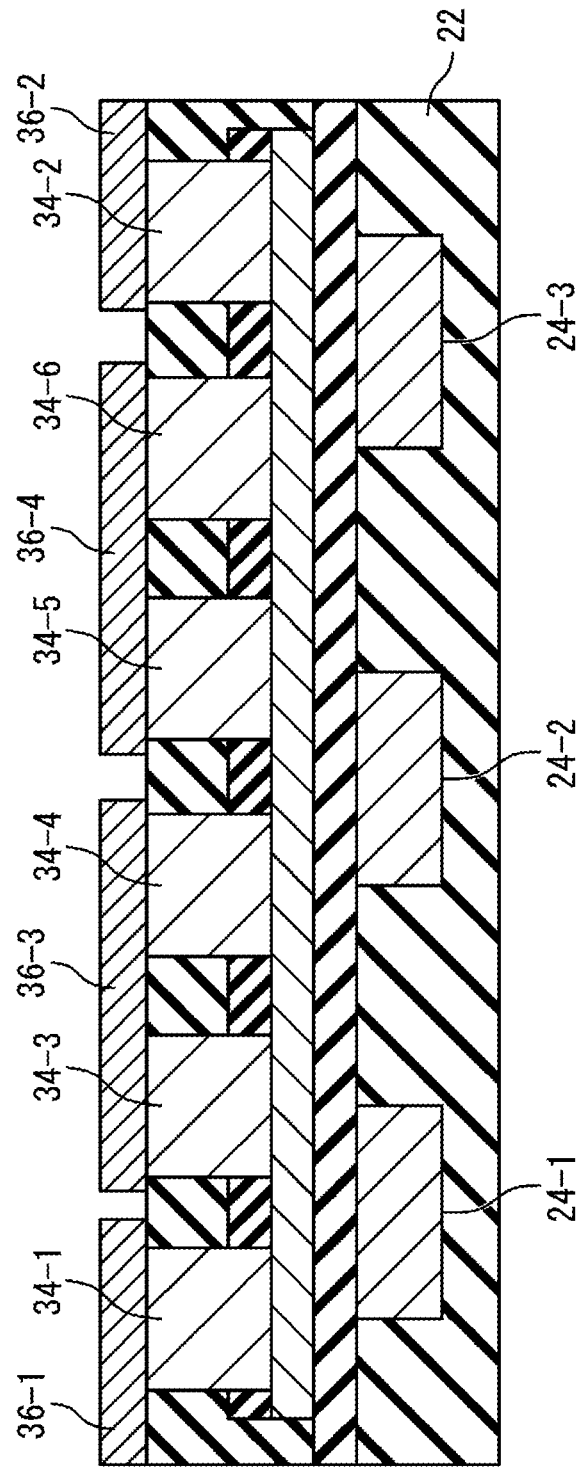
FIG. 18 is a cross-sectional view showing a cross-sectional structure of a wiring layer circuit in a semiconductor device along the D-D line of FIG. 16.

FIG. 17 is a diagram showing a layout of the semiconductor device according to the fifth embodiment. The layout is based on the layout of the inverter element shown in FIG. 8. The transistor Tr1 includes a gate electrode wiring 24-1, a source contact 34-1, and a drain contact 34-3. The source contact 34-1 is connected to the ground voltage Vss by a wiring pattern 36-1. In the present embodiment, patterns for the transistor Tr2 are added. The transistor Tr2 includes a gate electrode wiring 24-2, a source contact 34-5, and a drain contact 34-6. The source contact 34-5 is connected to the drain contact 34-3 by a wiring pattern 36-5. In the transistor Tr3, by a wiring pattern 36-6, a source contact 34-7 is connected to the drain contact 34-6 and, via a contact 34-8, to a gate electrode wiring 24-3. A drain contact 34-2 is connected to the power source voltage Vdd by a wiring pattern 36-2. In this manner, a NAND gate circuit can be formed in an extremely simple layout. FIG. 18 shows a cross-sectional structure along the D-D line of the semiconductor device shown in FIG. 17.

Figure 19:
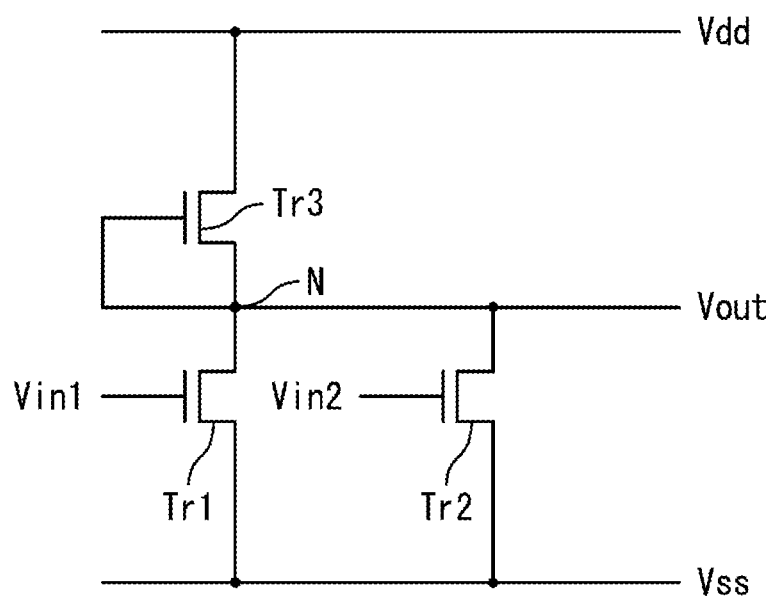
FIG. 19 is a circuit diagram showing a NOR element formed in a wiring layer circuit according a sixth embodiment.

Next, a semiconductor device according to a sixth embodiment will be explained. With reference to FIG. 19, transistors Tr1 and Tr2 are connected in parallel between a ground voltage Vss and a connection node N. A transistor Tr3 is a reversely connected transistor having a diode connection. Thereby, the transistor Tr3 shows a predetermined resistance value which is provided by a diode in the reverse direction. Input signals Vin1 and Vin2 are supplied to the gate electrodes of the transistors Tr1 and Tr2, respectively. An output signal Vout is taken out from the connection node N between the transistors Tr1 and Tr2, and Tr3.

As described above, a ring oscillator, a NAND gate, and a NOR gate, each of which uses an inverter, can be formed, and it becomes possible to forma logic circuit in the wiring layer circuit. That is, it is possible to configure an oscillation circuit and a logic circuit which can be formed by the use of only the wiring layer by forming a wiring layer circuit in the wiring layer. A high load resistance can be formed by the oxide semiconductor layer in an area saving manner, and an advantage of the area saving is extremely large compared to the case of using a diffusion layer resistance of the foundation layer or a wiring resistance. Further, the inverter originally uses a foundation-free load resistance and an advantage of the area saving obtained from this point is also extremely large.

Figure 20:
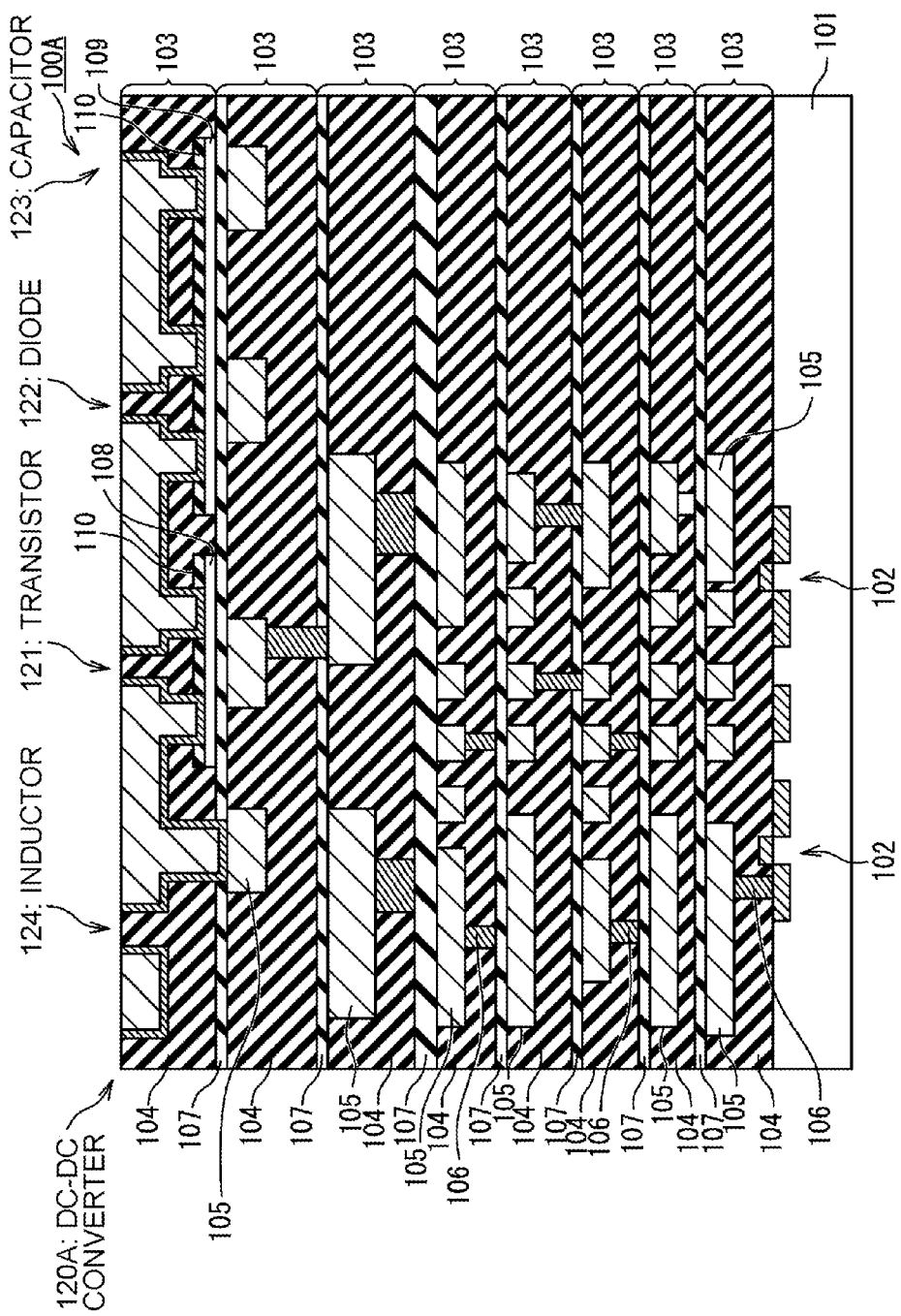
FIG. 20 is a diagram showing an example in which a wiring layer circuit is stacked over a foundation layer logic circuit.

FIG. 20 is a reference diagram of the present invention and FIG. 20 is a cross-sectional view showing a configuration of a semiconductor device 100A which is described in the Unpublished Patent Application (Japanese Patent Application No. 2011-213918). In the semiconductor device 100A of this embodiment, semiconductor layers 108 and 109 are formed in a wiring layer 103-1 which is located in the highest layer, and a DC-DC converter 120A is configured with a circuit element which is fabricated using the semiconductor layers. The DC-DC converter 120A is controlled by a foundation layer logic circuit which is provided with a semiconductor element 102 formed in a semiconductor substrate 101. Reference numerals 104, 105, 106, and 107 show an interlayer insulating film, a wiring, a contact, and a diffusion prevention film, respectively.

For details, in the present embodiment, the semiconductor layers 108 and 109 are formed in the wiring layer 103-1 which is located in the highest layer, and a transistor 121 is formed in the semiconductor layer 108, and a diode 122 and a capacitor 123 are formed in the semiconductor layer 109. The transistor 121 is an active element performing switching action in the DC-DC converter 120A. Further, the diode 122 is configured as a thin film transistor having a diode connection and provides a rectifying action in the DC-DC converter 120A. The DC-DC converter 120A is configured with these transistor 121, diode 122, and capacitor 123, and also an inductor 124 formed in the wiring layer 103-1. Here, when the semiconductor layers 108 and 109 are formed by an oxide semiconductor such as InGaZnO (IGZO), InZnO (IZO), ZnO, ZnAlO, and ZnCuO, the semiconductor layers 108 and 109 become n-type semiconductors. In this case, a carrier in the thin film transistor, which is used as the transistor 121 or the diode 122, is an electron.

From FIG. 20, it is found that a signal from the foundation layer logic circuit 2 is supplied to a gate electrode wiring of the transistor in the wiring layer circuit 4.

While the semiconductor devices have been explained hereinabove, these are only embodiments and various variation examples, which could be achieved by a person skilled in the art within a range of the present invention, are also included in the invention. Further, obviously the above embodiments can be applied in combination in a range without causing a technical inconsistency.

What is claimed is:

1. A semiconductor device including a wiring layer circuit which is formed over an insulating film, the semiconductor device including at least one inverter element, the inverter element comprising:
   a first transistor element; and
   a resistance element connected to the first transistor element via a connection node,
   the first transistor element including:
      a gate electrode embedded in an interlayer insulating film which includes the insulating film, the gate electrode being included in a first wiring layer;
      a gate insulating film formed over the interlayer insulating film and the gate electrode; and
      a first semiconductor layer formed over the gate insulating film between a source electrode and a drain electrode in a first region to cover the gate electrode, and
   the resistance element including
      a second semiconductor layer functioning as a resistance and formed over the gate insulating film in a second region without the gate electrode and another gate electrode, the second semiconductor layer connected via a first wiring pattern of a second wiring layer to the first transistor element and via a second wiring pattern of the second wiring layer to a power source,
   wherein the first semiconductor layer and the second semiconductor layer are formed in the same layer, and
   the first wiring pattern and the second wiring pattern are formed in the same layer.

2. The semiconductor device according to claim 1, wherein each of the first semiconductor layer and the second semiconductor layer is an oxide semiconductor layer.

3. The semiconductor device according to claim 1, further comprising:
   a semiconductor substrate; and
   a foundation layer logic circuit part formed over the semiconductor substrate, the foundation layer logic circuit part including:
      an active element; and
      a plurality of wiring layers formed above the active element,
   wherein the insulating film is formed over the plurality of wiring layers.

4. The semiconductor device according to claim 3, wherein the active element in the foundation layer logic circuit is connected to the first transistor of the inverter element in the wiring layer circuit.

5. The semiconductor device according to claim 1,
   wherein the inverter element further includes a second transistor which is connected to the first transistor in series between the first transistor and a ground voltage, and
   the resistance element is connected to a power source voltage, and
   wherein the second transistor includes:
      a second gate electrode which is embedded in the interlayer insulating film including the insulating film;
      a second gate insulating film which is formed over the interlayer insulating film and the second gate electrode; and
      a third semiconductor layer which is formed over the second gate insulating film between a source electrode and a drain electrode.

6. The semiconductor device according to claim 1,
   wherein the inverter element further includes a second transistor which is connected to the first transistor in parallel between the resistance element and a ground voltage,
   the resistance element is connected to a power source voltage, and
   the first transistor is connected to the ground voltage, and
   wherein the second transistor element includes
      a second gate electrode which is embedded in the interlayer insulating film including the insulating film;
      a second gate insulating film which is formed over the interlayer insulating film and the second gate electrode; and
      a third semiconductor layer which is formed over the second gate insulating film between a source electrode and a drain electrode.

7. The semiconductor device according to claim 1, wherein the wiring layer circuit includes an odd number of the inverter elements which are connected in a chain shape.

8. The semiconductor device according to claim 1, wherein the first semiconductor layer and the second semiconductor layer are formed in an integrated manner.

9. The semiconductor device according to claim 1, wherein the first semiconductor layer and the second semiconductor layer are formed to be different patterns.

10. A manufacturing method of a semiconductor device, comprising:
   forming a gate electrode which is embedded in an interlayer insulating film including an insulating layer, the gate electrode being included in a first wiring layer;
   forming a gate insulating film over the interlayer insulating film and the gate electrode;
   forming a first semiconductor layer over the gate insulating film in a first region to cover the gate electrode in a transistor region via the gate insulating film; and
   forming a second semiconductor layer over the gate insulating film in a second region without the gate electrode and another gate electrode, the second semiconductor layer being formed to be connected via a first wiring pattern of a second wiring layer to a wiring contact connected with the first semiconductor layer and via a second wiring pattern of the second wiring layer to a power source, the second semiconductor layer functioning as a resistance, the first semiconductor layer and the second semiconductor layer being formed in the same layer, and the first wiring pattern and the second wiring pattern being formed in the same layer.

11. A semiconductor device including a wiring layer circuit which is formed over an insulating film, the semiconductor device including at least one inverter element, the inverter element comprising:
   a first transistor element; and
   a resistance element connected to the first transistor element via a connection node,
   the first transistor element including:
      a gate electrode embedded in an interlayer insulating film which includes the insulating film;
      a gate insulating film formed over the interlayer insulating film and the gate electrode; and a first semiconductor layer formed over the gate insulating film between a source electrode and a drain electrode, and the resistance element including a second semiconductor layer functioning as a resistance without functioning as a portion of a second transistor element, the second semiconductor layer connected via a first wiring pattern of a second wiring layer to the first transistor element and via a second wiring pattern of the second wiring layer to a power source, the first wiring pattern and the second wiring pattern being formed in the same layer.

12. A semiconductor device including a wiring layer circuit which is formed over an insulating film, the semiconductor device including at least one inverter element, the inverter element comprising:

a first transistor element; and a resistance element connected to the first transistor element via a connection node, the first transistor element including:

a gate electrode embedded in an interlayer insulating film which includes the insulating film;

a gate insulating film formed over the interlayer insulating film and the gate electrode; and a first semiconductor layer formed over the gate insulating film between a source electrode and a drain electrode in a first region to cover the gate electrode, and the resistance element including a second semiconductor layer functioning as a resistance and formed over the gate insulating film in a second region without the gate electrode and another gate electrode, wherein the first semiconductor layer and the second semiconductor layer are formed in the same semiconductor layer, the entire first semiconductor layer and the entire second semiconductor layer being planar.

* * * * *